(12) United States Patent
Li et al.

(10) Patent No.: US 10,999,946 B2
(45) Date of Patent: May 4, 2021

(54) MICROCHIPS FOR DOWNHOLE DATA COLLECTION

(71) Applicants: Saudi Arabian Oil Company, Dhahran (SA); Yu Technologies, Inc., Tulsa, OK (US)

(72) Inventors: Bodong Li, Dhahran (SA); Chinthaka Pasan Gooneratne, Dhahran (SA); Guodong Zhan, Dhahran (SA); Zhaorui Shi, Ningbo (CN)

(73) Assignees: Saudi Arabian Oil Company, Dhahran (SA); Yu Technologies, Inc., Tulsa, OK (US)

( * ) Notice: Subject to any disclaimer, the term of this patent is extended or adjusted under 35 U.S.C. 154(b) by 0 days.

(21) Appl. No.: 16/415,286

(22) Filed: May 17, 2019

(65) Prior Publication Data

US 2020/0367378 A1  Nov. 19, 2020

(51) Int. Cl.
| | | |
|---|---|---|
| *H05K 5/02* | (2006.01) | |
| *B29C 70/72* | (2006.01) | |
| *E21B 47/00* | (2012.01) | |
| *H05K 1/18* | (2006.01) | |
| *H05K 3/28* | (2006.01) | |

(Continued)

(52) U.S. Cl.
CPC .......... *H05K 5/0247* (2013.01); *B29C 70/72* (2013.01); *E21B 47/00* (2013.01); *H05K 1/181* (2013.01); *H05K 3/284* (2013.01); *H05K 5/065* (2013.01); *B29L 2031/3481* (2013.01); *H05K 2201/1034* (2013.01); *H05K 2201/10151* (2013.01); *H05K 2201/10424* (2013.01); *H05K 2201/10545* (2013.01); *H05K 2203/1316* (2013.01); *H05K 2203/1327* (2013.01)

(58) Field of Classification Search
CPC .. B29L 2031/3481; H05K 2201/10151; H05K 2201/1034; H05K 2201/10424; H05K 2201/10545; H05K 2203/1316; H05K 2203/1327; H05K 5/0247; H05K 1/181; H05K 3/284; H05K 5/065; B29C 70/72; E21B 47/00
See application file for complete search history.

(56) References Cited

U.S. PATENT DOCUMENTS

| | | |
|---|---|---|
| 891,957 A | 6/1908 | Schubert |
| 7,255,582 B1 * | 8/2007 | Liao ..................... H01R 25/006 439/165 |
| 8,275,549 B2 | 9/2012 | Sabag et al. |

(Continued)

OTHER PUBLICATIONS

PCT International Search Report and Written Opinion issued in International Application No. PCT/US2020/032860 dated Aug. 11, 2020, 15 pages.

*Primary Examiner* — James Wu
*Assistant Examiner* — Hung Q Dang
(74) *Attorney, Agent, or Firm* — Fish & Richardson P.C.

(57) ABSTRACT

A microchip includes a PCB, a first contact feature positioned along a first area of the PCB, a second contact feature positioned along a second area of the PCB that is disposed opposite the first area, a contact frame including first and second contact members respectively coupled to the first and second contact features for signal communication between the first and second contact features and an external electronic device, and a housing enclosing an interior region of the microchip and carrying the first and second contact members of the contact frame.

17 Claims, 12 Drawing Sheets

(51) Int. Cl.
  *H05K 5/06*   (2006.01)
  *B29L 31/34*  (2006.01)

(56) References Cited

U.S. PATENT DOCUMENTS

| | | |
|---|---|---|
| 9,528,366 B2 | 12/2016 | Selman et al. |
| 2013/0076525 A1 | 3/2013 | Vu et al. |
| 2016/0356125 A1 | 12/2016 | Bello et al. |
| 2017/0328196 A1 | 11/2017 | Shi et al. |
| 2017/0328197 A1 | 11/2017 | Shi et al. |
| 2017/0332482 A1* | 11/2017 | Hauslmann ...... G06K 19/07771 |
| 2017/0350201 A1 | 12/2017 | Shi et al. |
| 2017/0350241 A1 | 12/2017 | Shi et al. |
| 2018/0177064 A1 | 6/2018 | Van Pol et al. |

\* cited by examiner

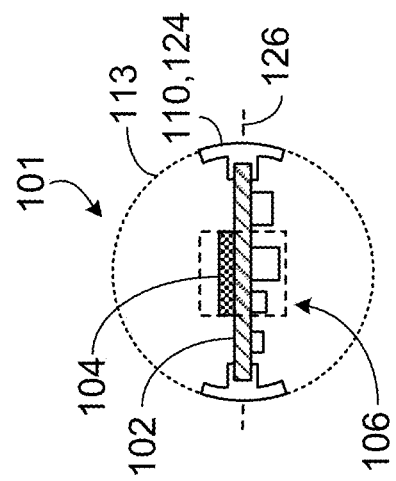
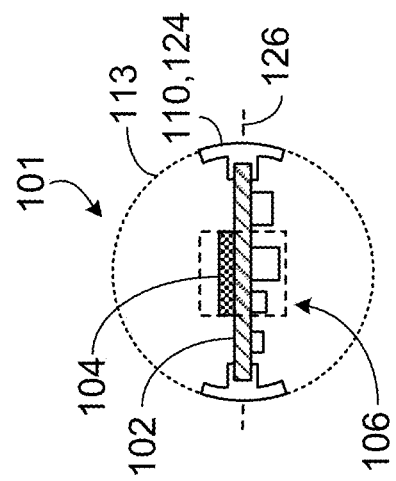
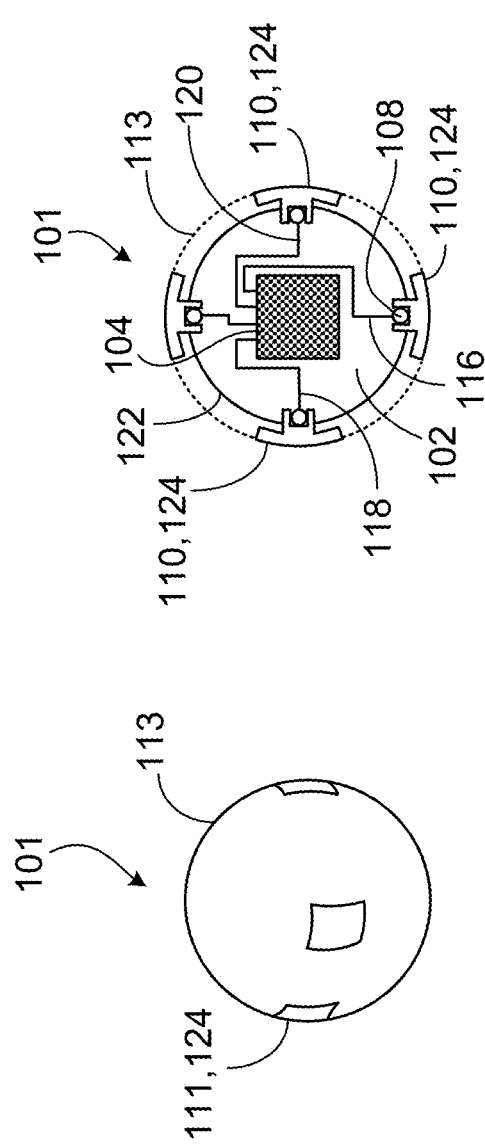
FIG. 2A
FIG. 2B
FIG. 2C
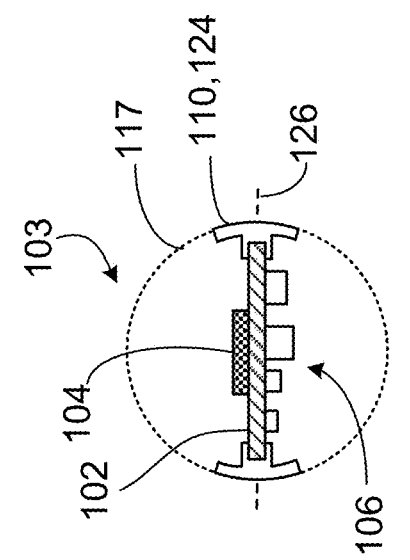
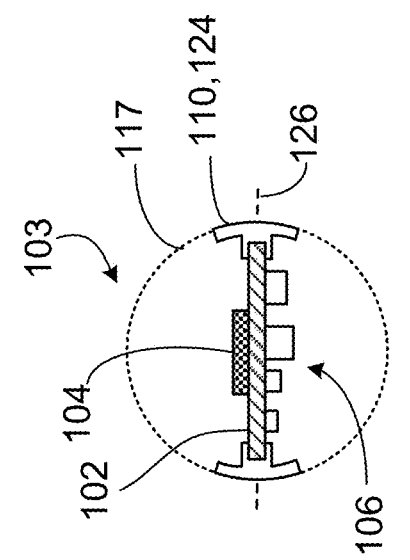
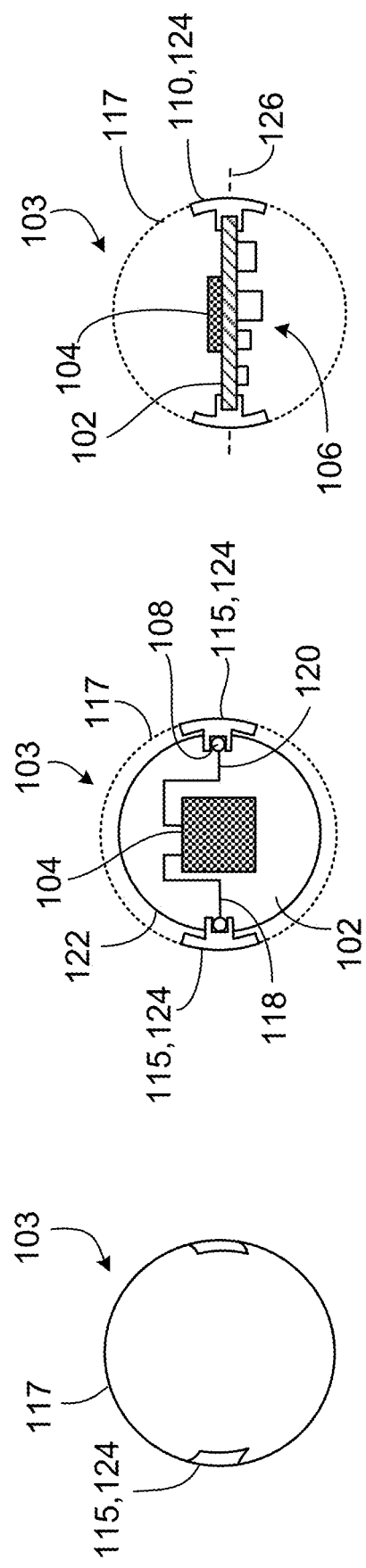
FIG. 3A
FIG. 3B
FIG. 3C

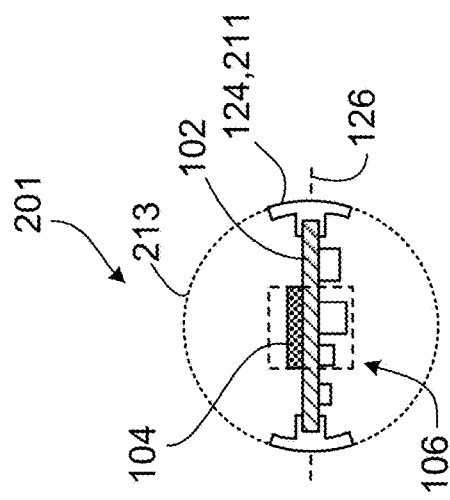
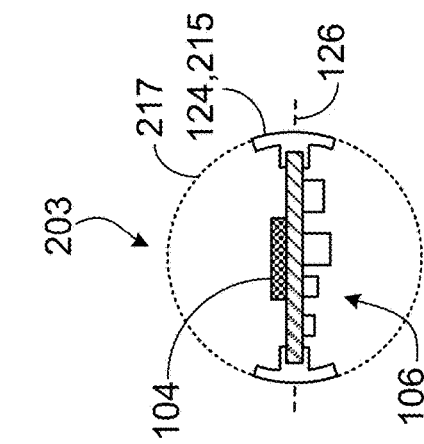
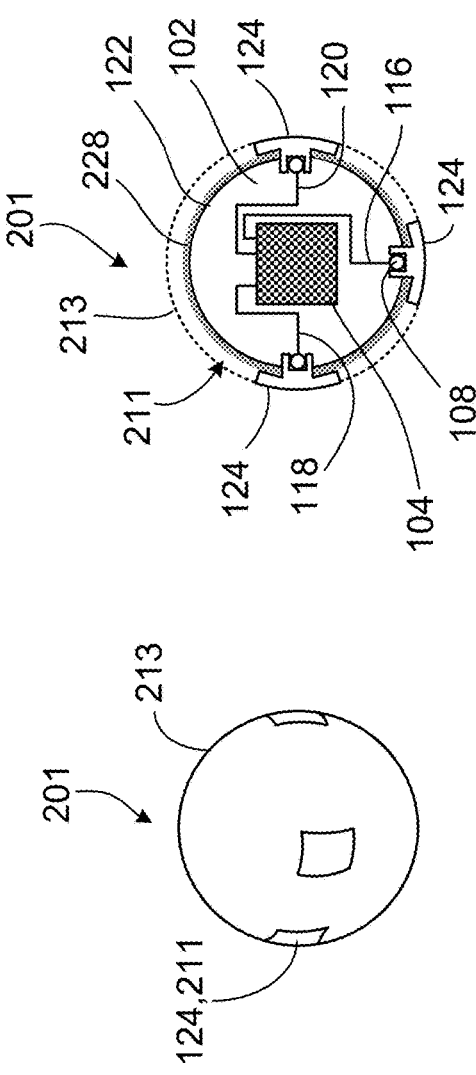
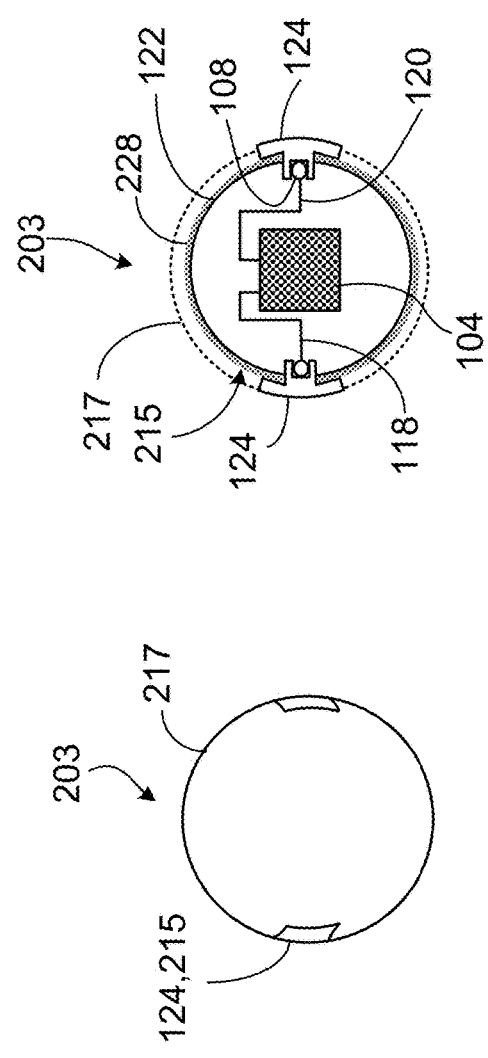

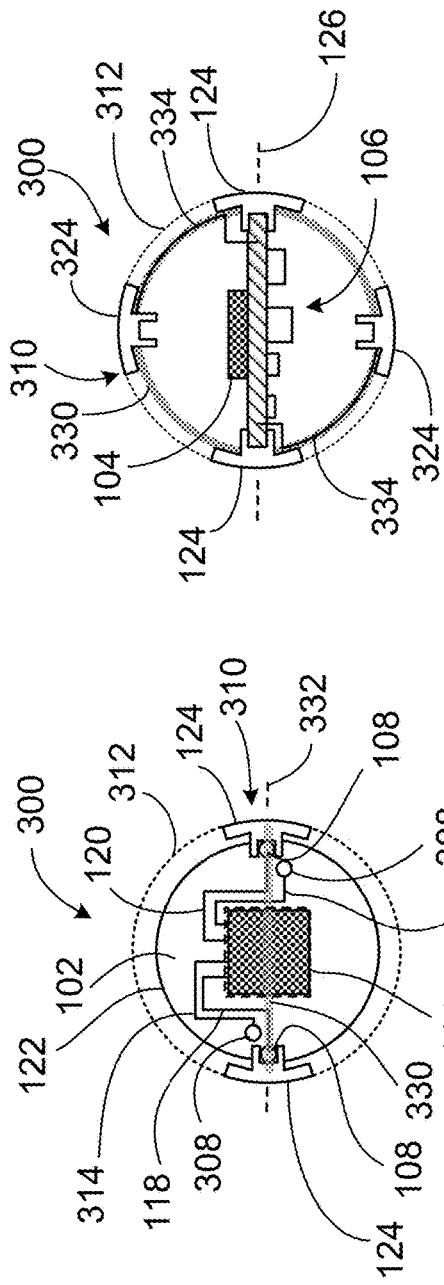
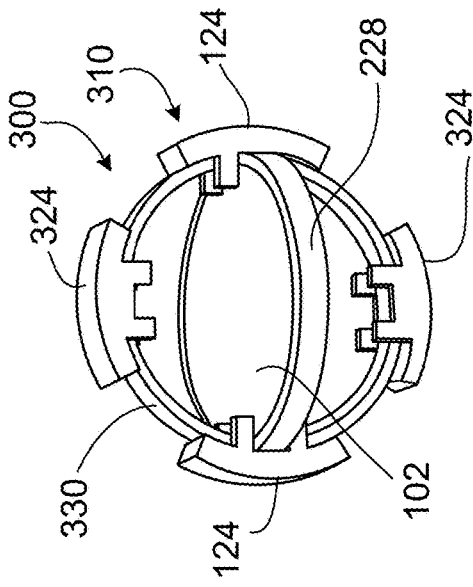
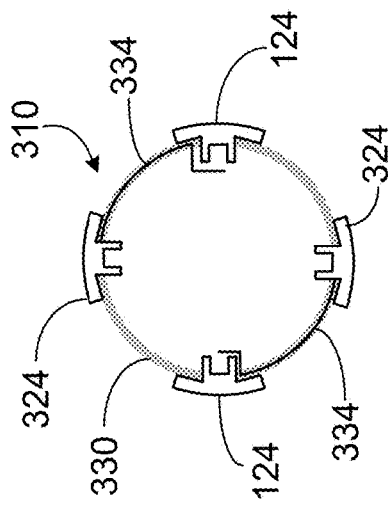
FIG. 7A
FIG. 7B
FIG. 7C
FIG. 7D

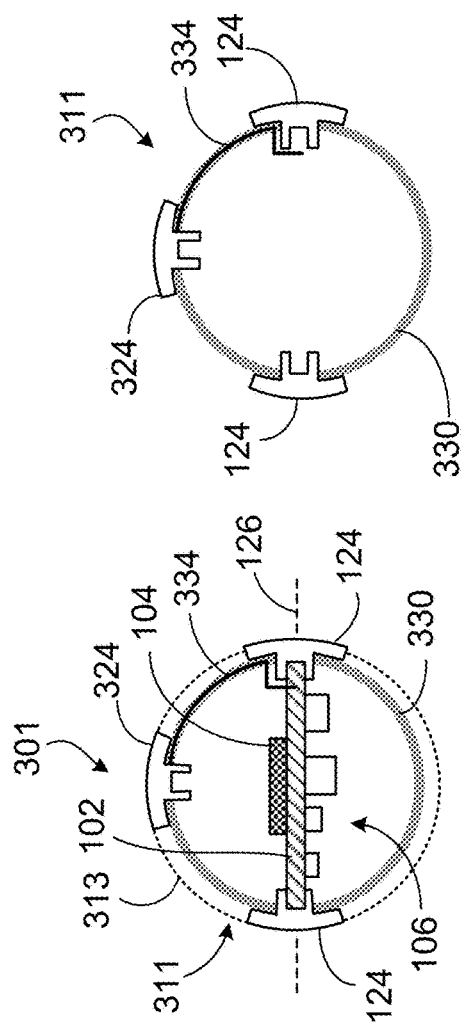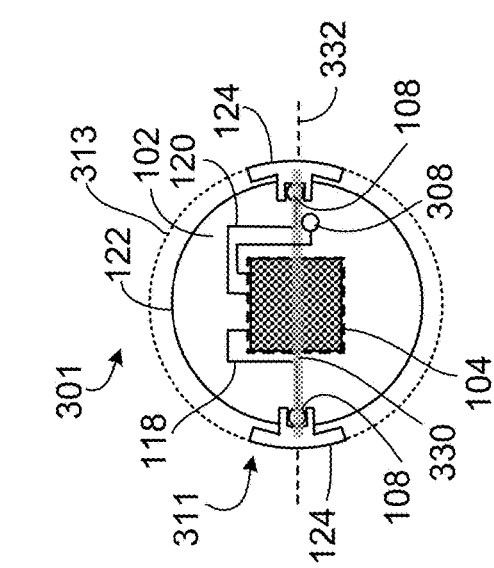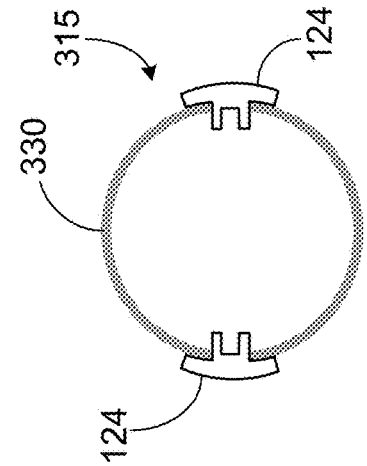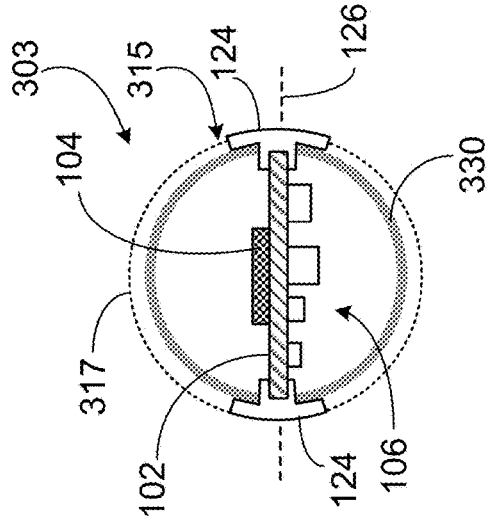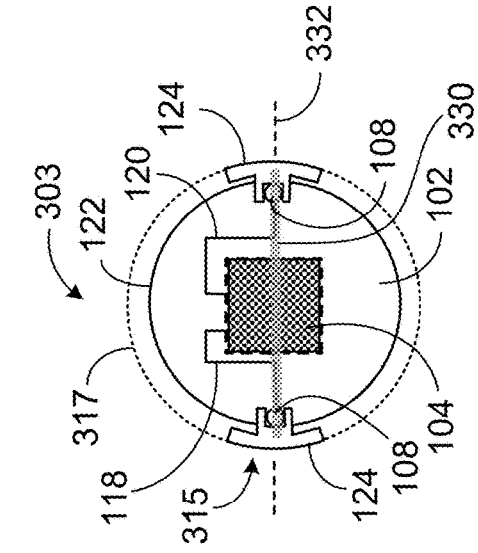

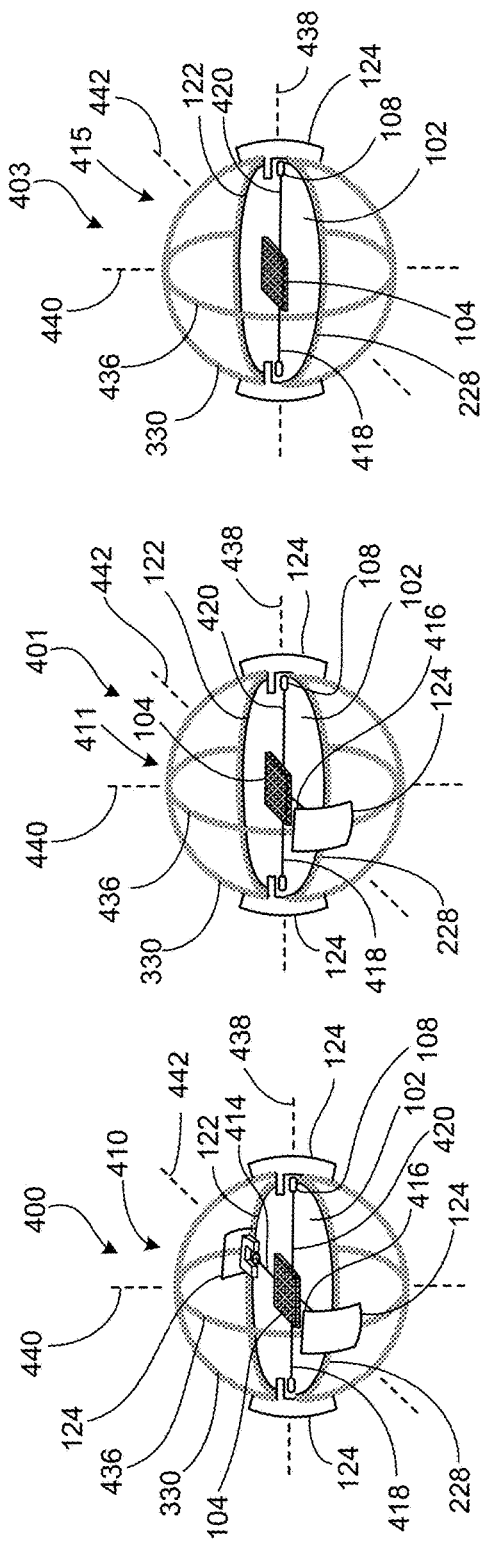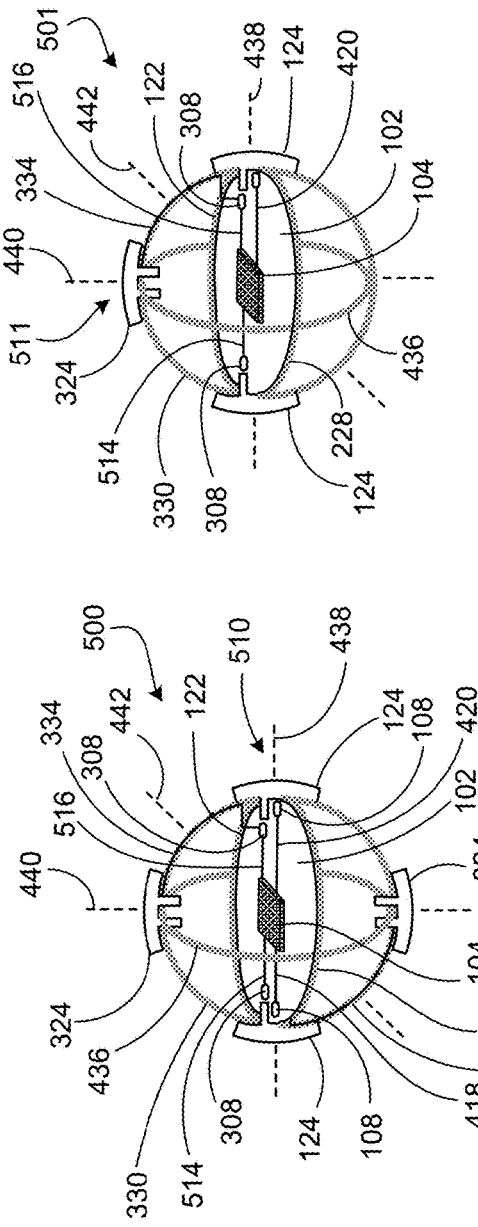

MICROCHIPS FOR DOWNHOLE DATA COLLECTION

TECHNICAL FIELD

This disclosure relates to microchips including supportive contact frames that are integrated with main printed circuit boards of the microchips and methods of manufacturing such microchips for oil and gas applications.

BACKGROUND

Microchips can deployed to a wellbore during a drilling operation in order to collect data from the wellbore. However, due to harsh downhole conditions, a large fraction of deployed microchips do not maintain mechanical integrity during drilling operations. For example, many of the microchips experience shearing or damage at weak points of protective encapsulations of the microchips. In some examples, the strength of a microchip is affected by the integrity of a motherboard of the microchip, bonding of a protective material of the microchip, and uniformity of a layer formed by the protective material. A non-conductive nature of the protective material may also make it difficult for the motherboard to transfer data and charge with external systems once the microchips have been recovered from the wellbore.

SUMMARY

This disclosure relates to microchips including supportive contact frames that are integrated with main printed circuit boards of the microchips and methods of manufacturing such microchips for oil and gas applications. The contact frames discussed herein provide direct electrical contact between contact features on a printed circuit board (PCB) and external circuits, while providing improved mechanical integrity of a microchip, providing improved bonding between contact nembers of the contact frame and contact features on the PCB, and facilitating generation of a microchip protective layer that is both reliable and consistent in thickness. Such contact frames include multiple contact members that are formed from conductive metal and positioned in direct or indirect contact with respective contact features disposed along an edge or an interior region of the PCB. For example, in some embodiments, a contact is a stand-alone component that is in direct contact with the a contact feature on a PCB. Such contacts may be positioned along a horizontal plane of the PCB.

In other embodiments, the contact frame may additionally include one or more reinforcement members (for example, peripheral o-ring frames) that reinforce a structure of a microchip. A reinforcement member may provide a mounting surface for a contact member or be free of contact members. In some instances, a reinforcement member may be oriented in the horizontal plane of the PCB such that a contact is in direct contact with the reinforcement member and in direct contact with a contact feature on the PCB. In some instances, the reinforcement member may be oriented in a vertical plane of the PCB such that a contact member is in direct contact with the reinforcement member and in indirect contact with a contact feature on the PCB. In such embodiments, the contact frame further includes an embedded electrode by which the contact member along the reinforcement member is coupled to the contact feature on the PCB.

In one aspect, a microchip includes a PCB, a first contact feature positioned along a first area of the PCB, a second contact feature positioned along a second area of the PCB that is disposed opposite the first area, a contact frame including first and second contact members respectively coupled to the first and second contact features for signal communication between the first and second contact features and an external electronic device, and a housing enclosing an interior region of the microchip and carrying the first and second contact members of the contact frame.

Embodiments may provide one or more of the following features.

In some embodiments, the contact frame further includes a reinforcement member that surrounds the PCB.

In some embodiments, the reinforcement member is positioned along a horizontal plane of the PCB.

In some embodiments, the reinforcement member is positioned along a vertical plane of the PCB.

In some embodiments, the reinforcement member is attached to the first and second contact members along a peripheral edge of the PCB.

In some embodiments, the first and second contact members are carried by the reinforcement member respectively at first and second locations spaced apart from the PCB.

In some embodiments, the contact frame further includes first and second electrodes that respectively extend between the first and second contact members and the first and second contact features positioned along the PCB.

In some embodiments, the reinforcement member is a first reinforcement member, and the contact frame further includes one or more additional reinforcement members that surround the PCB and that are oriented perpendicular to the first reinforcement member.

In some embodiments, the reinforcement member includes a non-conductive ring.

In some embodiments, the first and second contact members of the contact frame are directly connected to the first and second contact features positioned along the PCB.

In some embodiments, the first and second areas of the PCB disposed along a peripheral edge of the PCB.

In some embodiments, the first and second areas of the PCB are disposed along an interior region of the PCB.

In some embodiments, the contact frame further includes third and fourth contact members respectively coupled to third and fourth contact features positioned along the PCB for signal communication between the third contact features and the external electronic device.

In some embodiments, the first, second, third, and fourth contact members are spaced about 90 degrees apart from one another about a circumference of the housing.

In some embodiments, exterior surfaces of the first and second contact members are disposed flush with an exterior surface of the housing.

In some embodiments, the housing has a substantially spherical exterior shape.

In another aspect, a method of manufacturing a microchip includes processing a PCB to provide a first contact feature positioned along a first area of the PCB and a second contact feature positioned along a second area of the PCB that is disposed opposite the first area, installing a contact frame to the PCB to provide an assembly of the contact frame and the PCB in which first and second contact members of the contact frame are respectively coupled to the first and second contact features for signal communication between the first and second contact features and an external electronic device, positioning the assembly within a mold, and forming a housing around the assembly within the mold such that the housing carries the first and second contact members of the contact frame.

Embodiments may provide one or more of the following features.

In some embodiments, installing the contact frame to the PCB further includes surrounding the PCB with a reinforcement member of the contact frame.

In some embodiments, the method further includes curing a protective material around the assembly to form the housing.

In some embodiments, the method further includes maintaining the PCB along a central plane of the microchip while the protective material cures to form the housing.

The details of one or more embodiments are set forth in the accompanying drawings and description. Other features, aspects, and advantages of the embodiments will become apparent from the description, drawings, and claims.

DESCRIPTION OF DRAWINGS

FIGS. 2A-2C respectively are perspective, top, and side cross-sectional views of an example microchip including a contact frame with three stand-alone contact members positioned along a horizontal plane of a PCB.

FIGS. 3A-3C respectively are perspective, top, and side cross-sectional views of an example microchip including a contact frame with two stand-alone contact members positioned along a horizontal plane of a PCB.

FIGS. 5A-5C respectively are perspective, top, and side cross-sectional views of an example microchip including a contact frame with three contact members and a reinforcement member positioned along a horizontal plane of a PCB.

FIGS. 6A-6C respectively are perspective, top, and side cross-sectional views of an example microchip including a contact frame with two contact members and a reinforcement member positioned along a horizontal plane of a PCB.

FIGS. 7A and 7B respectively are top and side cross-sectional views of an example microchip including a contact frame with two stand-alone contact members positioned along a horizontal plane of a PCB and two reinforced contacts members together with a reinforcement member positioned along a vertical plane of a PCB.

FIG. 7C is a side cross-sectional view of the contact frame of the microchip of FIGS. 7A and 7B.

FIG. 7D is a perspective view of an interface of the contact members assembled with the reinforcement members of the microchip of FIGS. 7A and 7B. Other components of the microchip have been omitted for simplification.

FIGS. 8A and 8B respectively are top and side cross-sectional views of an example microchip including a contact frame with two stand-alone contact members positioned along a horizontal plane of a PCB and one reinforced contact member together with a reinforcement member positioned along a vertical plane of the PCB.

FIG. 8C is a side cross-sectional view of the contact frame of the microchip of FIGS. 8A and 8B.

FIGS. 9A and 9B respectively are top and side cross-sectional views of an example microchip including a contact frame with two stand-alone contact members positioned along a horizontal plane of a PCB and a reinforcement member positioned along a vertical plane of the PCB.

FIG. 9C is a side cross-sectional view of the contact frame of the microchip of FIGS. 9A and 9B.

FIG. 10 is a perspective view of an interior portion of an example microchip including a contact frame with four contact members positioned along a horizontal plane of a PCB and three reinforcement members positioned along horizontal and vertical planes of the PCB.

FIG. 11 is a perspective view of an interior portion of an example microchip including a contact frame with three contact members positioned along a horizontal plane of a PCB and three reinforcement members positioned along horizontal and vertical planes of the PCB.

FIG. 12 is a perspective view of an interior portion of an example microchip including a contact frame with two contact members positioned along a horizontal plane of a PCB and three reinforcement members positioned along horizontal and vertical planes of the PCB.

FIG. 13 is a perspective view of an interior portion of an example microchip including a contact frame with two contact members positioned along a horizontal plane of a PCB, two contact members positioned along a vertical plane of the PCB, and three reinforcement members positioned along horizontal and both vertical planes of the PCB.

FIG. 14 is a perspective view of an interior portion of an example microchip including a contact frame with two contact members positioned along a horizontal plane of a PCB, one contact member positioned along a vertical plane of the PCB, and three reinforcement members positioned along horizontal and both vertical planes of the PCB.

DETAILED DESCRIPTION

Figure 1A:
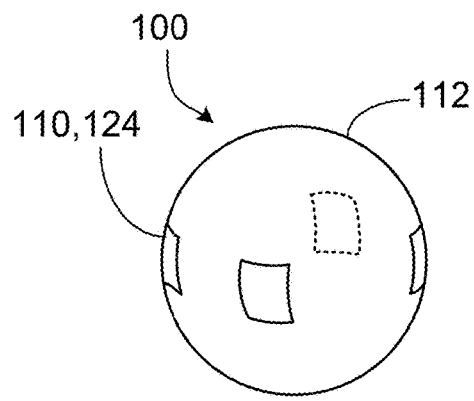
FIGS. 1A-1C respectively are perspective, top, and side cross-sectional views of an example microchip including a contact frame with four stand-alone contact members positioned along a horizontal plane of a PCB.
Figure 1B:
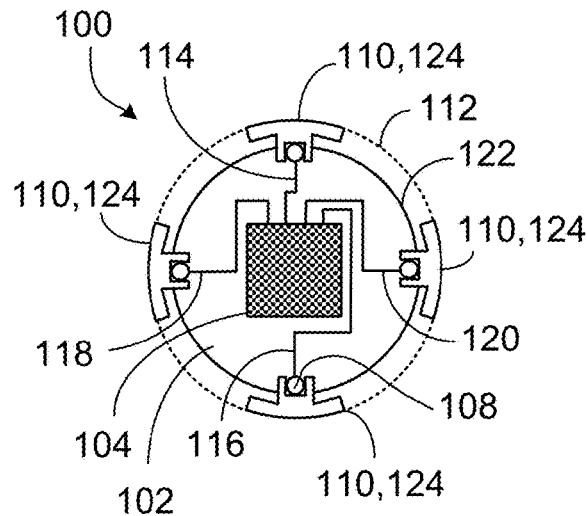
Figure 1C:
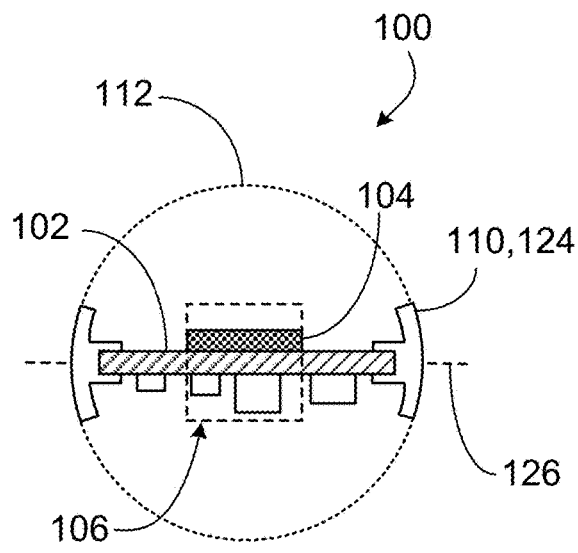
Figure 1D:
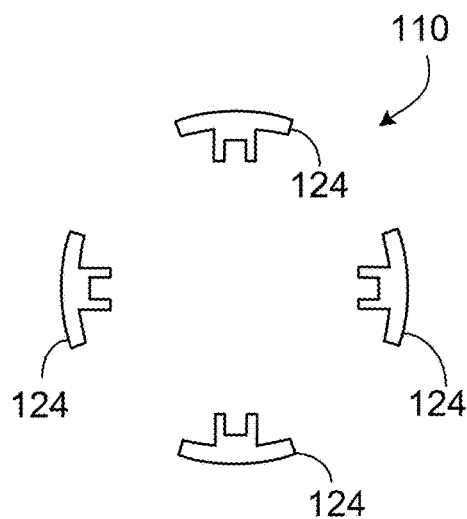
FIG. 1D is a top view of the contact frame of the microchip of FIGS. 1A-1C.
Figure 4A:
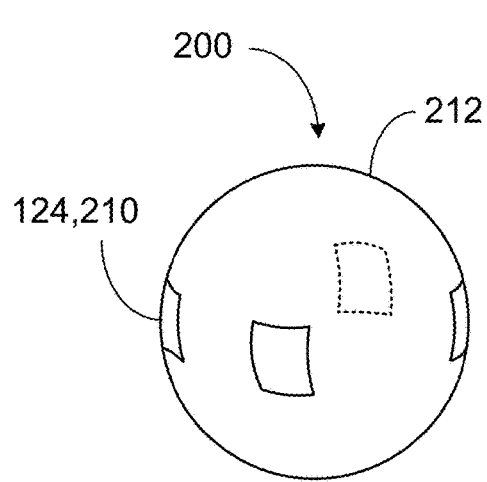
FIGS. 4A-4C respectively are perspective, top, and side cross-sectional views of an example microchip including a contact frame with four reinforced contact members and a reinforcement member positioned along a horizontal plane of a PCB.
Figure 4B:
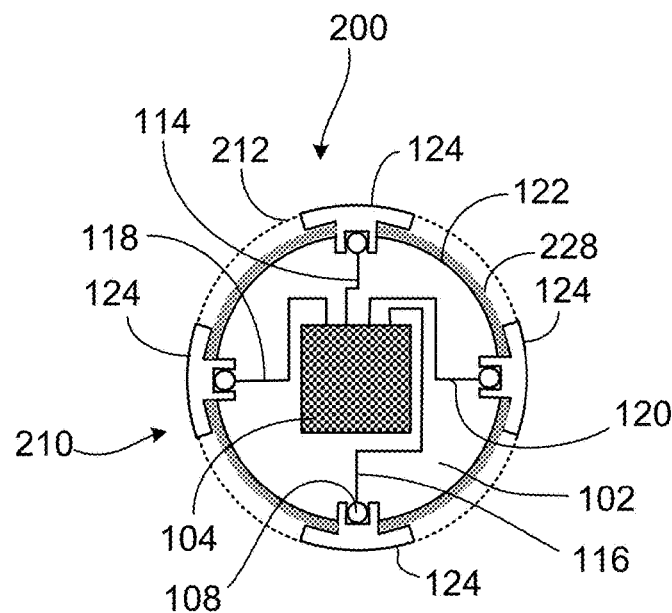
Figure 4C:
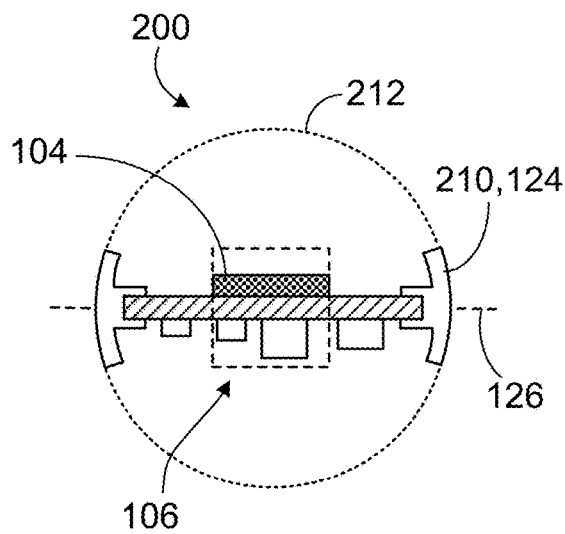
Figure 4D:
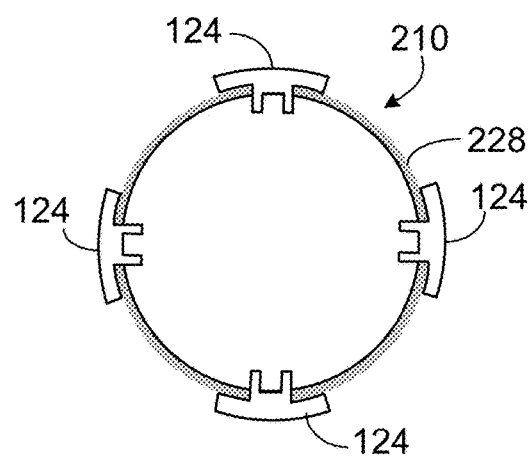
FIG. 4D is a top view of the contact frame of the microchip of FIGS. 4A-4C.

FIGS. 1A-1C illustrate multiple views of a microchip 100 designed to collect data from a wellbore during a drilling operation. The microchip 100 includes a printed circuit board (PCB) 102 (for example, a motherboard or a main PCB), a microcontroller 104 disposed along one side of the microchip 100, various functional components 106 (for example, one or more microprocessors, memory devices, sensors, and communication modules) disposed along a second, opposite side of the microchip 100, four contact features 108 (for example, soldering pads) disposed on the PCB 102 for signal communication with a data downloading device, a contact frame 110 that provides direct electrical contact (for example, direct electrical connection) between the contact features 108 and the data downloading device, and a housing 112 that contains the various other components of the microchip 100.

Multiple circuit lines respectively extend between the microcontroller 104 and the contact features 108, including a positive power supply line 114, a ground line 116, a first signaling line 118 (for example, a transceiving line), and a second signaling line 120 (for example, a transceiving line). The contact features 108 are disposed along an edge 122 of the PCB 102 for easy and accessible electromechanical connection to the contact frame 110. The PCB 102 has a shape generally of a thin disc and typically has a diameter of about 5 millimeters (mm) to about 10 mm and a thickness of about 0.4 mm to about 2 mm.

Referring to FIGS. 1A-1D, the contact frame 110 includes four stand-alone contacts members 124 that are respectively, rigidly connected to (for example, mounted or soldered to) the contact features 108 such that the contact frame 100 is integral with the PCB 102. The contact members 124 of the contact frame 110 are positioned along a horizontal plane 126 of the PCB 102 (for example, passing substantially through a center point of the PCB 102) and are spaced about 90 degrees apart from each other about a circumference of the PCB 102. The contact members 124 are relatively small in size. For example, the contact members 124 typically have a width of about 0.5 mm to about 3 mm, a length of about 0.5 mm to about 3 mm, and a height of about 0.5 mm to about 3 mm. The contact members 124 are made of a conductive metal (for example, stainless steel, gold, tin, or an alloy, such as gold-palladium or gold-tin) for transmitting an electrical current between the contact features 108 and the data downloading device.

The housing 112 is a body (for example, a filled shell) that encapsulates and protects the other components of the microchip 100 from harsh downhole conditions within a wellbore. Furthermore, the housing 112 carries the contact members 124 in a manner such that exterior surfaces of the contact members 124 are disposed flush with an exterior surface of the housing 112. The housing 112 is typically made of a polymer material, such as epoxy, urethane, acrylic, silicone, or polyester. The housing 112 has a substantially spherical shape (for example, a generally spherical exterior surface profile) and typically has a diameter of about 5 mm to about 15 mm.

In some embodiments, a microchip may include a different number of circuit lines, a corresponding number of contact features, and a contact frame with a corresponding number of contacts members. For example, FIGS. 2A-2C illustrate multiple views of a microchip 101 that lacks the positive power supply line 114 of the microchip 100 and accordingly includes only three contact features 108 and a contact frame 111 with three contact members 124 instead of four contact members 124. The microchip 101 is otherwise substantially similar in construction and function to the microchip 100. Accordingly, the microchip 101 further includes the PCB 102, the microcontroller 104, the components 106, the circuit lines 116, 118, 120, and a housing 113 that contains the various other components of the microchip 101.

Similarly, FIGS. 3A-3C illustrate multiple views of a microchip 103 that lacks the positive power supply line 114 and the ground line 116 of the microchip 100 and accordingly includes only two contact features 108 and a contact frame 115 with two contact members 124 instead of four contact members 124. The microchip 103 is otherwise substantially similar in construction and function to the microchip 100. Accordingly, the microchip 103 further includes the PCB 102, the microcontroller 104, the components 106, the circuit lines 118, 120, and a housing 117 that contains the various other components of the microchip 103. In some embodiments, the microchips 101, 103 may be used with a wireless power charging module for supplying power to the microchips 101, 103 such that either or both of the power supply line 114 and the ground line 116 are not needed on-board the PCB 102.

In some embodiments, a microchip includes a contact frame with an additional reinforcement member. For example, referring to FIGS. 4A-4D, a microchip 200 includes a contact frame 210 with four contact members 124, as well as a reinforcement member 228 that reinforces the contact members 124. The microchip 200 is otherwise substantially similar in construction and function to the microchip 100. Accordingly, the microchip 200 further includes the PCB 102, the microcontroller 104, the components 106, the contact features 108, the circuit lines 114, 116, 118, 120, and a housing 212 that contains the various other components of the microchip 200. The reinforcement member 228 is provided as an o-ring frame member that is strongly bonded to the contact members 124 and to the edge 122 of the PCB 102 along the horizontal plane 126 of the PCB 102 such that the reinforcement member 228 is parallel to the PCB 102. Accordingly, the reinforcement member 228 typically has an inner diameter that is about equal to the diameter of the PCB 102 and a thickness of about 0.4 mm to about 3 mm. The reinforcement member 228 is typically made of one or more non-conductive, high-strength materials such that the reinforcement member 228 provides additional structural support for an arrangement of the contact members 124 and for a mechanical integrity of the housing 212. Example materials from which the reinforcement member 228 is typically made include ceramics, polymers, carbon fibers, and other materials.

In some embodiments, microchips that are otherwise substantially similar in construction and function to the microchip 200 may include a different number of circuit lines, a corresponding number of contact features, and a contact frame with a corresponding number of contacts members. For example, FIGS. 5A-5C respectively illustrate perspective, top, and side cross-sectional views of a microchip 201 that lacks the positive power supply line 114 of the microchip 200 and accordingly includes only three contact features 108 and a contact frame 211 with three contact members 124 instead of four contact members 124. The microchip 201 is otherwise substantially similar in construction and function to the microchip 200. Accordingly, the microchip 201 further includes the PCB 102, the microcontroller 104, the components 106, the circuit lines 116, 118, 120, and a housing 213 that contains the various other components of the microchip 201.

Similarly, FIGS. 6A-6C respectively illustrate perspective, top, and side cross-sectional views of a microchip 203 that lacks the positive power supply line 114 and the ground line 116 of the microchip 200 and accordingly includes only two contact features 108 and a contact frame 215 with two contact members 124 instead of four contact members 124. The microchip 203 is otherwise substantially similar in construction and function to the microchip 200. Accordingly, the microchip 203 further includes the PCB 102, the microcontroller 104, the components 106, the circuit lines 118, 120, and a housing 217 that contains the various other components of the microchip 203. As discussed above with respect to the microchips 101, 103, the microchips 201, 203 may be used with a wireless power charging module for supplying power to the microchips 201, 203.

In some embodiments, a microchip includes a contact frame with a reinforcement member that has a vertical orientation. For example, referring to FIGS. 7A-7D, a microchip 300 includes such a contact frame 310. The microchip 300 further includes the PCB 102, the microcontroller 104, the components 106, two contact features 108 positioned along the edge 122 of the PCB 102, two contact features 308 positioned along an interior region of the PCB 102, four circuit lines, and a housing 312 that contains the various other components of the microchip 300. The circuit lines include a positive power supply line 314 that extends to a contact feature 308, a ground line 316 that extends to a contact feature 308, a first signaling line 318 (for example, a transceiving line) that extends to a contact feature 108, and a second signaling line 320 (for example, a transceiving line) that extends to a contact feature 108.

The contact frame 310 includes two contact members 124 positioned along the edge 122 of the PCB 102, a vertically oriented reinforcement member 330, and two contact members 324 positioned along the reinforcement member 330 and spaced apart from the PCB 102. The contact members 324 are substantially similar in construction and function to the contact members 124, except that the contact members 324 are spaced apart from the PCB 102. The reinforcement member 330 is provided as an o-ring frame member that passes through a vertical plane 332 of the PCB 102 (for example, passing through the center point of the PCB 102) such that the reinforcement member 330 is perpendicular to the PCB 102. The reinforcement member 330 is strongly bonded to the contact members 124 and to the edge 122 of the PCB 102 along the horizontal plane 126, as well as to the contact members 324 that are spaced apart from the PCB 102. In this manner, the contact members 324 are carried by the reinforcement member 330 in the vertical plane 332. Accordingly, the reinforcement member 330 is equipped with two embedded electrodes 334 that extend vertically from the contact members 324 to the contact features 308 along the interior region of the PCB 102. The reinforcement member 330 typically has a material formulation, an inner diameter, and a thickness that are about the same as the respective parameters of the reinforcement member 228, thereby providing additional structural support for an arrangement of the contact members 124, 324 and for a mechanical integrity of the housing 312.

In some embodiments, microchips that are otherwise substantially similar in construction and function to the microchip 300 may include a different number of circuit lines, a corresponding number of contact features, and a contact frame with a corresponding number of contacts members. For example, FIGS. 8A and 8B respectively illustrate top and side cross-sectional views of a microchip 301 that lacks the positive power supply line 314 of the microchip 300. Referring to FIG. 8C, the microchip 301 accordingly includes a contact frame 311 with one contact member 324 and one embedded electrode 334 instead of two contact members 324 and two embedded electrodes 334. The microchip 301 is otherwise substantially similar in construction and function to the microchip 300. Accordingly, the microchip 301 further includes the PCB 102, the microcontroller 104, the components 106, the contact features 108, the circuit lines 118, 120, 316, and a housing 313 that contains the various other components of the microchip 301.

Similarly, FIGS. 9A and 9B respectively illustrate top and side cross-sectional views of a microchip 303 that lacks the positive power supply line 314 and the ground line 316 of the microchip 300. Referring to FIG. 9C, the microchip 303 accordingly includes only two contact features 108 and a contact frame 315 without any contact members 324. The microchip 303 is otherwise substantially similar in construction and function to the microchip 300. Accordingly, the microchip 303 further includes the PCB 102, the microcontroller 104, the components 106, the circuit lines 118, 120, and a housing 317 that contains the various other components of the microchip 303. As discussed above with respect to the microchips 101, 103, the microchips 301, 303 may be used with a wireless power charging module for supplying power to the microchips 301, 303.

While the microchips 200, 201, 203, 300, 301, 303 have been described and illustrated as including the contact frames 210, 211, 215, 310, 311, 315 with two-dimensional reinforcement members 228, 330 that are substantially oriented in one plane (for example, the horizontal plane 126 or the vertical plane 332 of the PCB 102), in some embodiments, a microchip includes a contact frame with a three-dimensional reinforcement structure. For example, FIG. 10 illustrates a microchip 400 that includes a contact frame 410 with the reinforcement member 228, the reinforcement member 330, and a reinforcement member 436 that together provide three-dimensional structure support for the microchip 400. The microchip 400 is otherwise substantially similar in construction and function to the microchip 200. Accordingly, the microchip 400 further includes the PCB 102, the microcontroller 104, the components 106, four circuit lines, four contact features 108 disposed along the edge 122 of the PCB 102, and a housing (omitted for clarity) that contains the various other components of the microchip 400. The circuit lines include a positive power supply line 414, a ground line 416, a first signaling line 418 (for example, a transceiving line), and a second signaling line 420 (for example, a transceiving line).

As discussed above with respect to the microchips 200, 300, the reinforcement member 228 is positioned along the horizontal plane 126 of the PCB 102, and the reinforcement member 330 is positioned along the vertical plane 332 of the PCB 102. The reinforcement member 436 is positioned along a vertical plane of the PCB 102 (for example, passing through the center point of the PCB 102) that is oriented perpendicular to both the horizontal plane 126 and the vertical plane 332. In FIG. 10, the horizontal plane 126 is defined by axes 438 and 442, the vertical plane 332 is defined by axes 438 and 440, and the additional vertical plane is defined by axes 440 and 442. Similar to the reinforcement members 228, 330, the reinforcement member 436 is provided as an o-ring frame member. Each of the reinforcement members 332, 436 is strongly bonded to the edge 122 of the PCB 102 and to two of the contact members 124 of the contact frame 410. The reinforcement member 436 typically has a material formulation, an inner diameter, and a thickness that are about equal to the respective parameters of the reinforcement members 228, 330, thereby providing additional structural support for an arrangement of the contact members 124 and for a mechanical integrity of the housing 412.

In some embodiments, microchips that are otherwise substantially similar in construction and function to the microchip 400 may include a different number of circuit lines, a corresponding number of contact features, and a contact frame with a corresponding number of contacts members. For example, FIG. 11 illustrates a microchip 401 that lacks the positive power supply line 414 of the microchip 400 and the corresponding contact feature 108 such that a contact frame 411 of the microchip 401 accordingly includes three contact members 124 instead of four contact members 124. The microchip 401 is otherwise substantially similar in construction and function to the microchip 400. Accordingly, the microchip 401 further includes the PCB 102, the microcontroller 104, the components 106, three contact features 108, the circuit lines 416, 418, 420, and a housing (omitted for clarity) that contains the various other components of the microchip 401.

Similarly, FIG. 12 illustrates a microchip 403 that lacks the positive power supply line 414 and the ground line 416 of the microchip 400 and accordingly includes only two contact features 108 and a contact frame 415 with only two contact members 124. The microchip 403 is otherwise substantially similar in construction and function to the microchip 400 such that the microchip 403 further includes the PCB 102, the microcontroller 104, the components 106, the circuit lines 418, 420, and a housing (omitted for clarity) that contains the various other components of the microchip 403. As discussed above with respect to the microchips 101, 103, the microchips 401, 403 may be used with a wireless power charging module for supplying power to the microchips 401, 403.

While the microchips 400, 401, 403 have been described and illustrated as including the contact frame 410 with contact members 124 that are all positioned along the horizontal plane 126 of the PCB 102, in some embodiments, a microchip that is otherwise similar in construction and function to the microchip 400 may include a contact frame with contact members positioned along a vertical plane of the PCB 102. For example, FIG. 13 illustrates a microchip 500 that includes a contact frame 510 with two contact members 124 positioned along the edge 122 of the PCB 102 in the horizontal plane 122 (for example, indicated by the axis 438) and two contact members 324 that are spaced apart from the PCB 102 along the reinforcement members 330, 436 in the vertical plane 332 (for example, indicated by the axis 440) and the vertical plane defined by the axis 442.

The microchip 500 includes two contact features 108 disposed along the edge 122 of the PCB 102, the first and second signaling lines 418, 420 that respectively extend to these two contact features 108, two contact features 308 disposed along an interior region of the PCB 102, and a positive power supply line 514 and a ground line 516 that respectively extend to these two contact features 308. Therefore, the reinforcement member 330 is equipped with the embedded electrodes 334 for connection between the contact members 324 and the interior contact features 308. The microchip 500 is otherwise substantially similar in construction and function to the microchip 400. Accordingly, the microchip 500 further includes the microcontroller 104, the components 106, and a housing (omitted for clarity) that contains the various other components of the microchip 500.

In some embodiments, microchips that are otherwise substantially similar in construction and function to the microchip 500 may include a different number of circuit lines, a corresponding number of contact features, and a contact frame with a corresponding number of contacts members. For example, FIG. 14 illustrates a microchip 501 that lacks the positive power supply line 514 of the microchip 500 and the corresponding contact feature 108 such that a contact frame 511 of the microchip 501 accordingly includes one contact member 324 and associated embedded electrode 334 instead of two contact members 324 and two embedded electrodes 334. The microchip 501 is otherwise substantially similar in construction and function to the microchip 500. Accordingly, the microchip 501 further includes the PCB 102, the microcontroller 104, the components 106, the circuit lines 516, 518, 520, the contact features 124 as part of the contact frame 511, and a housing (omitted for clarity) that contains the various other components of the microchip 501.

Figure 15:
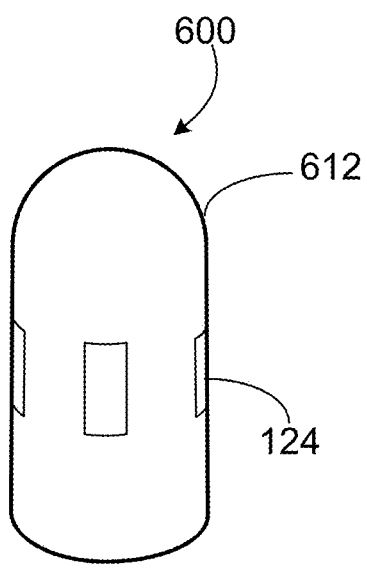
FIG. 15 is a perspective view of an example microchip including a bullet-shaped housing and four contact members positioned along a horizontal plane of a PCB.
Figure 16:
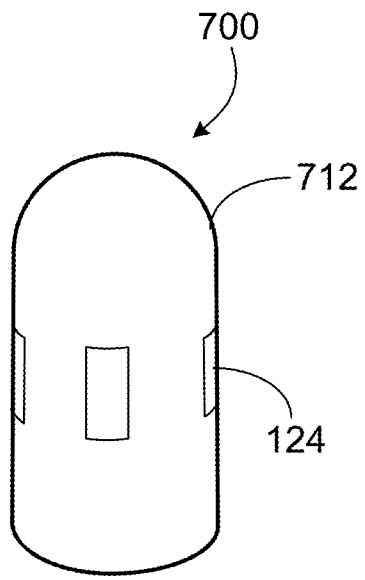
FIG. 16 is a perspective view of an example microchip including a bullet-shaped housing and three contact members positioned along a horizontal plane of a PCB.
Figure 17:
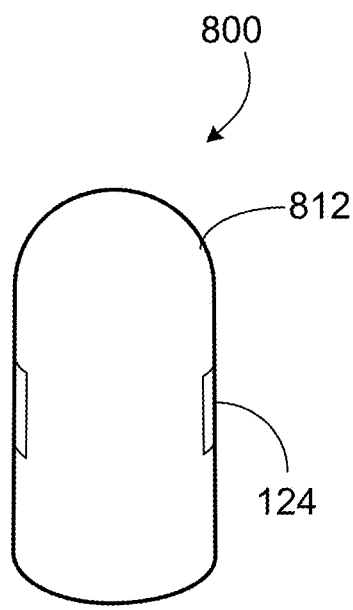
FIG. 17 is a perspective view of an example microchip including a bullet-shaped housing and two contact members positioned along a horizontal plane of a PCB.

While the above-discussed microchips have been described and illustrated as including a housing with a substantially spherical external shape, in some embodiments, a microchip that is otherwise substantially similar in construction in function to any of the above-discussed microchips may include a housing with a non-spherical external shape. For example, FIGS. 15, 16, and 17 respectively illustrate microchips 600, 700, 800 that include a bullet-shaped housing 612, 712, 812. The microchips 600, 700, 800 are otherwise substantially similar in construction and function to one or more of the above-discussed microchips and include contact members 124 as part of a contact frame.

While the above-discussed microchips have been described and illustrated contact features 108, 308 embodied as soldering pads, in some embodiments, a microchip that is otherwise substantially similar in construction and function to the any of the above-discussed microchips may instead include a different type of contact feature, such as a through hole or another type of contact features.

Figure 18:
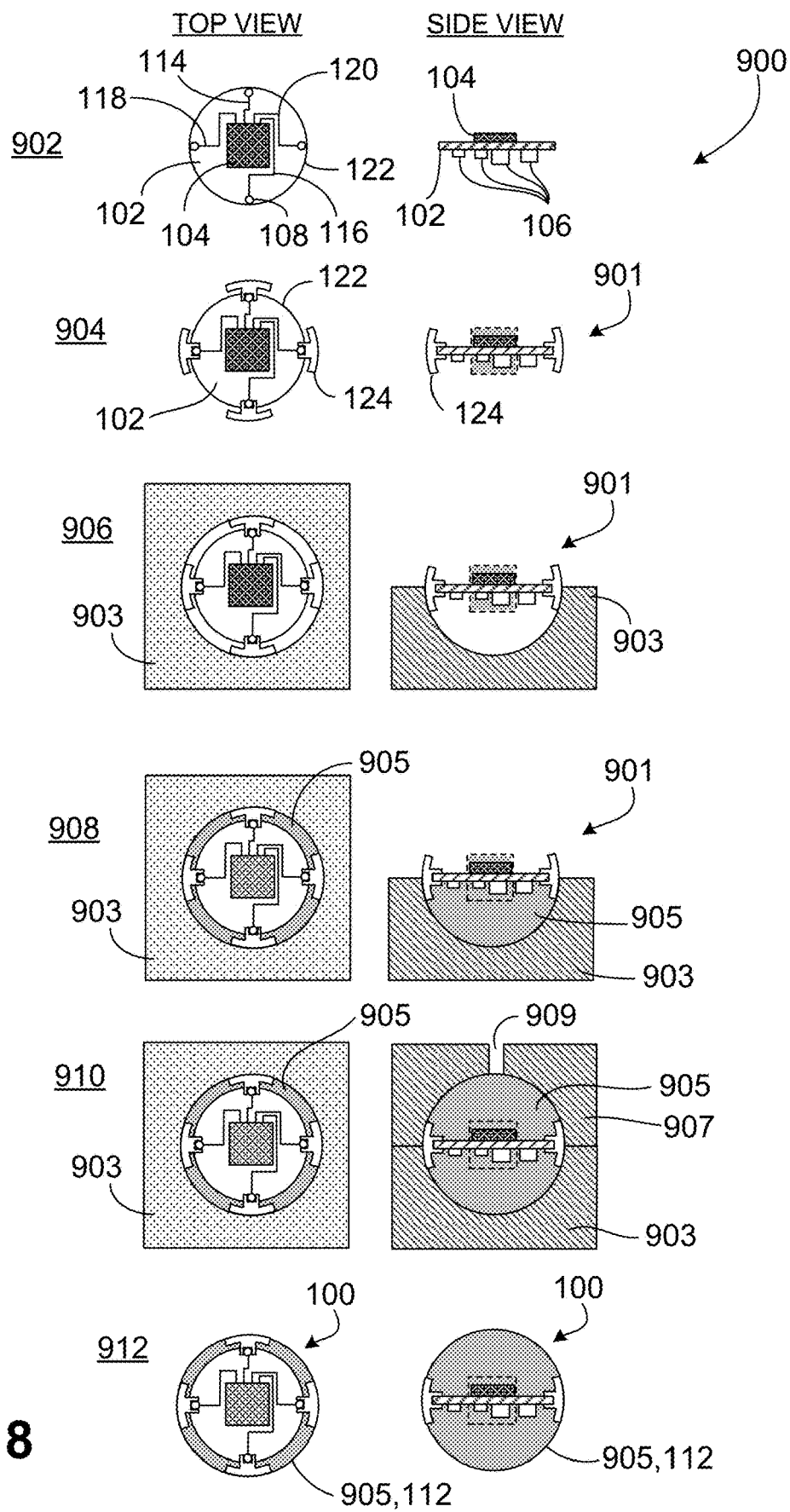
FIG. 18 illustrates an example method of manufacturing the microchip of FIGS. 1A-1C.

FIG. 18 illustrates an example process 900 for manufacturing the example microchip 100. In an initial step 902, the PCB 102 (for example, the motherboard) is manufactured. For example, a program is burned into the microcontroller 104, the components 106 and the contact features 108 are soldered onto the PCB 102, and the PCB 102 is tested. In a next step 904, the contact frame 110 is assembled (for example, mounted or soldered) onto the edge 122 of the PCB 102. In a next step 906, an assembly 901 of the PCB 102 and the contact frame 110 is placed and aligned in a lower casting cavity 901 (for example, a lower mold). In a next step 908, a protective material 905 (for example, an epoxy, urethane, acrylic, silicone, or polyester) is deposited into the lower casting cavity 903 to fill the lower casting cavity 903 around the assembly 901. In a next step 910, an upper casting cavity 907 (for example, an upper mold) is assembled with the lower casting cavity 903 and more of the protective material 905 is deposited into the upper casting cavity 907 through a refill port 909 in the upper casting cavity 907 to fill the upper casting cavity 907 around the assembly 901. In a next step 912, the protective material 905, surrounding the assembly 901, is cured at room temperature or in a heated environment to form the housing 112. The protective material 905 of the housing 112 provides the microchip 100 with chemical resistance, protection against high temperature, and protection against high impact force. After curing, the microchip 100 undergoes post-processing, which may include one or more of surface finishing, functional tests, and quality tests.

Figure 19A:
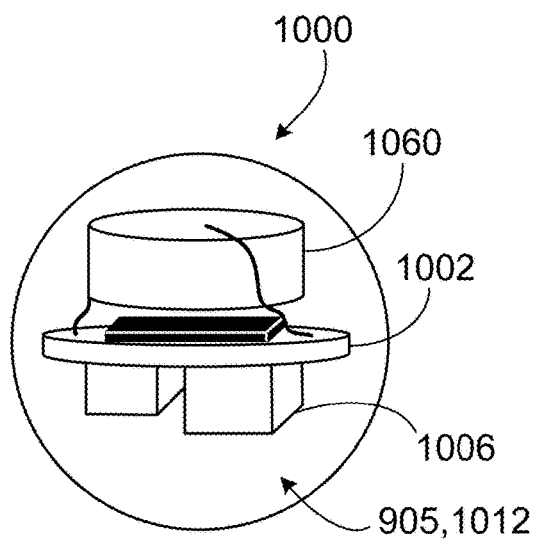
FIGS. 19A and 19B respectively illustrate an example microchip without a contact frame at a relatively early stage of curing and at a relatively late stage of curing during a manufacturing process.
Figure 19B:
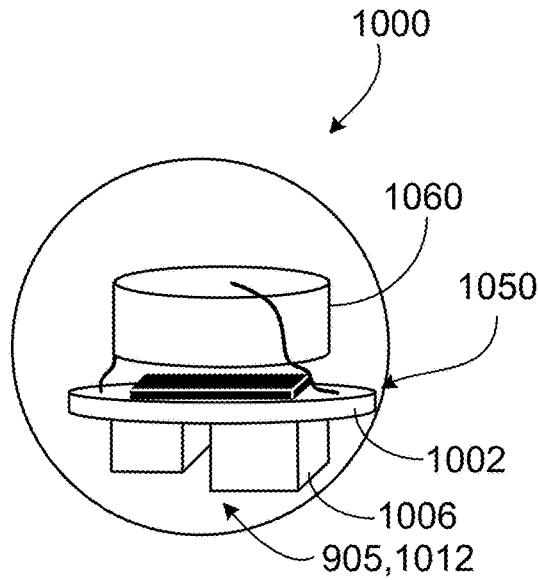
Figure 19C:
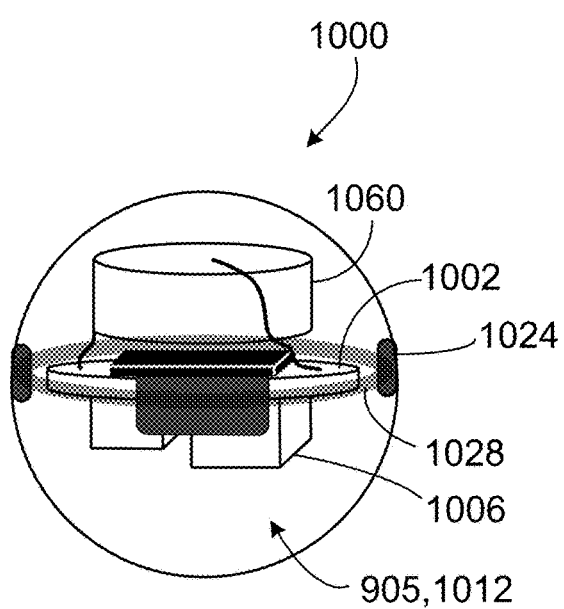
FIG. 19C illustrates an example microchip that includes a contact frame at a relatively late stage of curing during a manufacturing process.

The above-discussed contact frames (for example, both with and without o-ring reinforcement members), as implemented in the manufacturing process 900 or in similar manufacturing processes, provide enhanced mechanical integrity, provide improved bonding, and allow for formation of reliable housings with consistent thickness, all while offering direct electrical contact to external circuits via contact members located at exterior surfaces of the housings. As illustrated in FIG. 19A with respect to an example microchip 1000, a manufactured PCB 1002 is designed to be positioned at a center of the microchip 1000 with a battery 1060 couple thereto upon completion of the fabrication process. However, as illustrated in FIG. 19B, absent a contact frame (for example, such as any of the above-discussed contact frames), the PCB 1002 tends to sink downward in the protective material 905 while curing due to gravity. Accordingly, the PCB 1002 may undesirably locate to a position near a surface of the protective material 905, thereby causing a weak point 1050 in a cured housing 1012 that can make the PCB 1002 and components attached thereto susceptible to damage under harsh downhole conditions. In contrast, and as illustrated in FIG. 19C, including a contact frame 1010 with the microchip 1000 can maintain the PCB 1002 at a central position of the protective material 905. For example, an o-ring reinforcement member 1028 and contact members 1024 of the contact frame 1010 can provide mechanical protection for the PCB 1002, especially along a peripheral edge of the PCB 1002.

Figure 20:
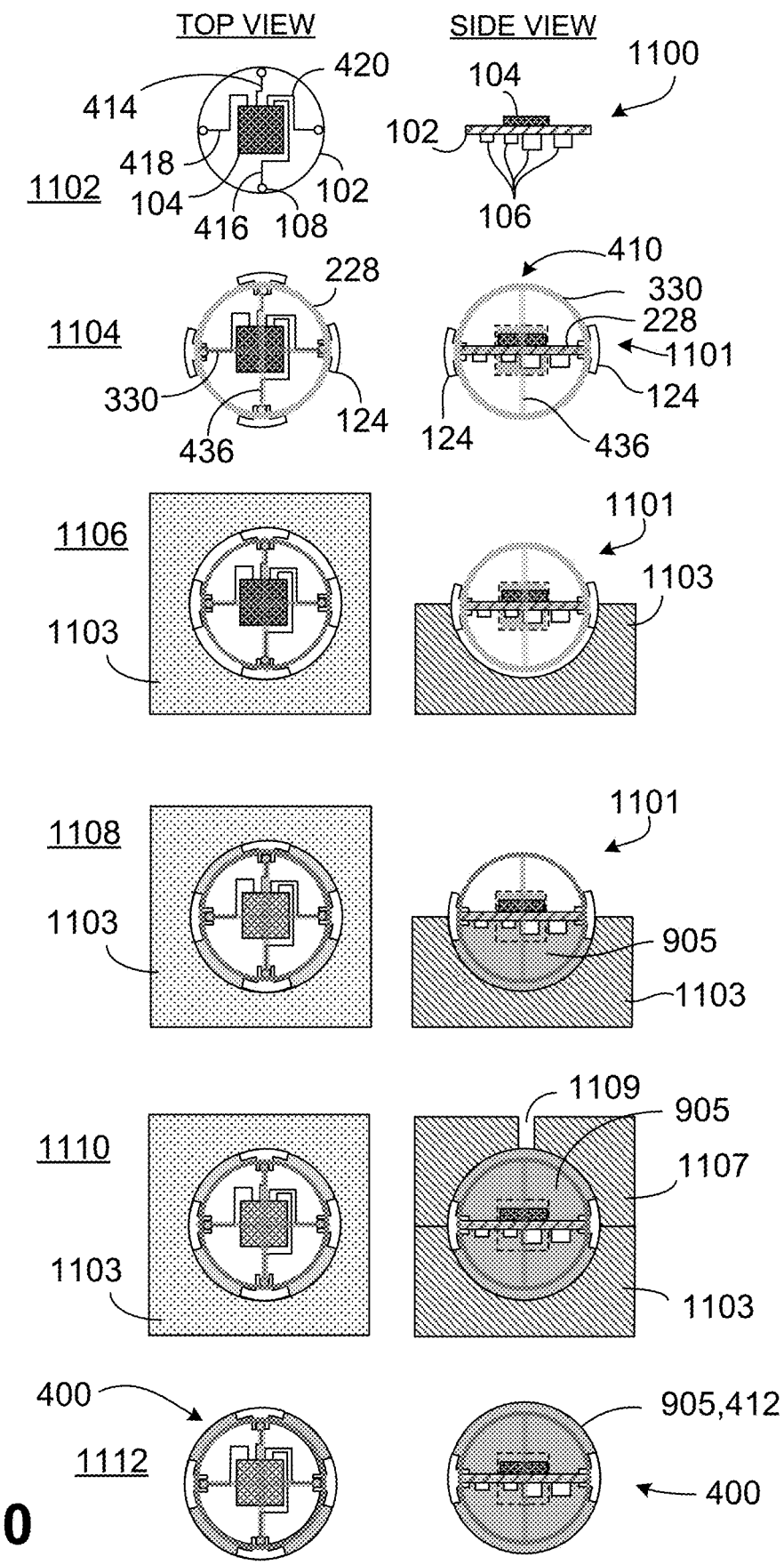
FIG. 20 illustrates an example method of manufacturing the microchip of FIG. 10.

In some embodiments, any of the above-discussed microchips that include one or more o-ring reinforcement members may be fabricated according to a process that is substantially similar to the manufacturing process 900 discussed above. For example, FIG. 20 illustrates a manufacturing process 1100 by which the microchip 400 is fabricated. In an initial step 1102, the PCB 102 is manufactured. In a next step 1104, the contact frame 410 is assembled (for example, mounted or soldered) onto the edge 122 of the PCB 102. In a next step 1106, an assembly 1101 of the PCB 102 and the contact frame 410 is placed and aligned in the lower casting cavity 1101. In a next step 1108, protective material 905 is deposited into the lower casting cavity 1103 to fill the lower casting cavity 1103 around the assembly 1101. In a next step 1110, the upper casting cavity 1107 is assembled with the lower casting cavity 1103 and more of the protective material 905 is deposited into the upper casting cavity 1107 through the refill port 1109 in the upper casting cavity 1107 to fill the upper casting cavity 1107 around the assembly 1101. In a next step 1112, the protective material 905, surrounding the assembly 1101, is cured at room temperature or in a heated environment to form the housing 412. After curing, the microchip 400 undergoes post-processing.

Figure 21:
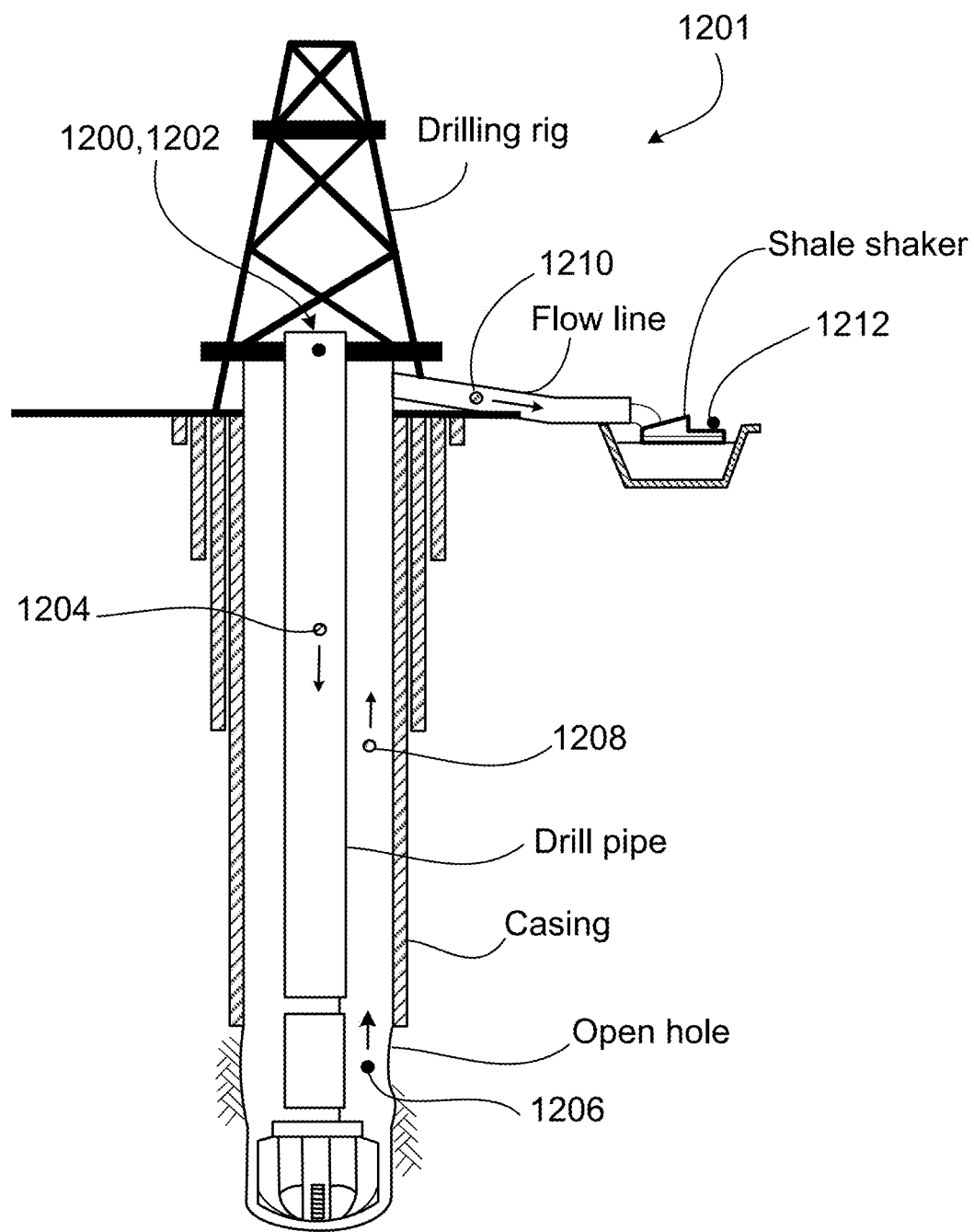
FIG. 21 illustrates an example method of collecting data from a wellbore using an example microchip during a drilling operation.

After fabrication, any of the above-discussed microchips may be deployed to collect downhole data during a drilling operation. For example, FIG. 21 illustrates a drilling operation 1201 carried out using multiple distributed microchips 1200. The microchips 1200 may be embodied as any of the microchips discussed above. During the drilling operation 1201, the microchips 1200 are dropped from a top of a drill pipe (1202) and carried downward by a mudflow (1204). After reaching a bottom hole assembly, the mud pushes the microchips 1200 through a bit nozzle and open hole (1206) and upward through a casing annulus (1208). The microchips 1200 are then carried out by the mudflow through the flow line (1210) and delivered to a shale shaker (1212) for recovery. Throughout the process, logging measurements are recorded in the memory of the microchips 1200, which can later be downloaded. Depth information associated with each measurement point is calibrated by a timestamp of the recorded data and a mud flow rate. In this way, the microchips 1200 are able to record a distribution of the downhole parameters along the entire wellbore.

Compared to conventional logging techniques such as wireline logging and logging/measuring while drilling (M/LWD), the microchips discussed herein are a lightweight, cost effective solution to access information along any portion of a wellbore, including at a very bottom of the wellbore, a top portion of an annulus, and anywhere between these regions. Accordingly, the microchips discussed herein can provide valuable diagnostic information after a limited delay time for microchip recovery, which represents better timeliness than some other conventional techniques, such as wireline logging. In some embodiments, the microchips discussed herein may also carry more comprehensive data (for example, along an entire wellbore) as compared to a real-time mode of some other conventional techniques, such as M/LWD. In contrast to some other conventional techniques (for example, utilizing an intelligent/wired drill pipe), the microchips discussed herein are also designed to work seamlessly with current drilling systems, which minimizes risks and costs otherwise associated with adopting a new logging technique.

While the above-discussed microchips have been described and illustrated as useful for downhole data collection in oil and gas applications, in some embodiments, any of the above-discussed microchips may be utilized in other applications, such as geological explorations.

While the above-discussed microchips have been described as including certain dimensions, sizes, shapes, arrangements, and materials have been described and illustrated as being utilized with respect to certain methods, in some embodiments, microchips that are substantially similar in construction and function to any of the above-discussed microchips may include one or more different dimensions, sizes, shapes, arrangements, and materials and may be utilized with respect to a different method.

Other embodiments are also within the scope of the following claims.

What is claimed is:

1. A microchip, comprising:
   a printed circuit board (PCB) disposed within an interior region of the microchip;
   a first contact feature positioned along a first area of the PCB within the interior region;
   a second contact feature positioned along a second area of the PCB that is disposed opposite to the first area and within the interior region;
   a contact frame comprising:
   a first contact member and a second contact member respectively coupled to the first contact feature and to the second contact feature for signal communication between the first and second contact features and an external electronic device, and
   a reinforcement member to which the first and second contact members are directly attached such that the reinforcement member provides structural support for an arrangement of the first and second contact members, the reinforcement member being disposed within the interior region and surrounding the PCB; and
   a housing carrying the first and second contact members and enclosing the interior region and the reinforcement member,
   wherein the reinforcement member has a same cross-sectional shape as the housing and extends about an inner surface of the housing along an entire circumference of the housing such that the reinforcement member further provides structural support for the housing.

2. The microchip of claim 1, wherein the reinforcement member is positioned along a horizontal plane of the PCB.

3. The microchip of claim 1, wherein the reinforcement member is positioned along a vertical plane of the PCB.

4. The microchip of claim 1, wherein the reinforcement member is attached to the first and second contact members along a peripheral edge of the PCB.

5. The microchip of claim 1, wherein the first and second contact members are carried by the reinforcement member respectively at first and second locations that are spaced apart from the PCB such that the first and second contact members are not directly connected to the PCB.

6. The microchip of claim 5, wherein the contact frame further comprises first and second electrodes that respectively extend between the first and second contact members and the first and second contact features positioned along the PCB.

7. The microchip of claim 1, wherein the reinforcement member is a first reinforcement member, and the contact frame further comprises one or more additional reinforcement members that surround the PCB and that are oriented perpendicular to the first reinforcement member.

8. The microchip of claim 1, wherein the reinforcement member comprises a non-conductive ring.

9. The microchip of claim 1, wherein the first and second contact members of the contact frame are directly connected to the first and second contact features positioned along the PCB.

10. The microchip of claim 1, wherein the first and second areas of the PCB are disposed along a peripheral edge of the PCB.

11. The microchip of claim 1, wherein the first and second areas of the PCB are disposed along an interior region of the PCB.

12. The microchip of claim 1, wherein the contact frame further comprises third and fourth contact members respectively coupled to third and fourth contact features positioned along the PCB for signal communication between the third and fourth contact features and the external electronic device.

13. The microchip of claim 12, wherein the first, second, third, and fourth contact members are spaced about 90 degrees apart from one another about a circumference of the housing.

14. The microchip of claim 1, wherein exterior surfaces of the first and second contact members are disposed flush with an exterior surface of the housing.

15. The microchip of claim 1, wherein the housing has a substantially spherical exterior shape.

16. The microchip of claim 15, wherein the reinforcement member comprises a non-conductive ring that extends about a circumference of the housing to provide structural support for the housing.

17. The microchip of claim 1, wherein the microchip comprises an equal number of contact features and contact members such that each contact member is dedicated to a respective contact feature.

* * * * *